United States Patent [19]

Satoh

[11] Patent Number: 4,999,581

[45] Date of Patent: Mar. 12, 1991

[54] MAGNETIC RESONANCE IMAGING SYSTEM

[75] Inventor: Kozo Satoh, Yokohama, Japan

[73] Assignee: Kabushiki Kaisha Toshiba, Kawasaki, Japan

[21] Appl. No.: 362,443

[22] PCT Filed: Sep. 30, 1988

[86] PCT No.: PCT/JP88/01005

§ 371 Date: May 30, 1989

§ 102(e) Date: May 30, 1989

[87] PCT Pub. No.: WO89/02723

PCT Pub. Date: Apr. 6, 1989

[30] Foreign Application Priority Data

Sep. 30, 1987 [JP] Japan .................. 62-244355

[51] Int. Cl.[5] .......................................... G01R 33/20
[52] U.S. Cl. ....................................... 324/309; 324/314
[58] Field of Search ............... 324/300, 307, 309, 310, 324/311, 312, 313, 318, 322

[56] References Cited

U.S. PATENT DOCUMENTS

| | | | |
|---|---|---|---|
| 4,620,153 | 10/1986 | Hino | 324/309 |
| 4,649,346 | 3/1987 | Yeung et al. | 324/309 |
| 4,691,162 | 9/1987 | Van Uijen | 324/309 |
| 4,724,388 | 2/1988 | Sano | 324/309 |
| 4,736,160 | 4/1988 | Sano et al. | 324/307 |
| 4,777,625 | 10/1988 | Sakui et al. | 365/189 |
| 4,819,207 | 4/1989 | Sakui et al. | 365/222 |

FOREIGN PATENT DOCUMENTS 55-112556 8/1980 Japan .
60-179643 9/1985 Japan .
60-238973 11/1985 Japan .
60-263842 12/1985 Japan .
61-48752 3/1986 Japan .

OTHER PUBLICATIONS

IEEE Journal of Solid-State Circuits, vol. SC-21, No. 5, pp. 618-626, "A 4-Mbit DRAM with Trench-Transistor Cell"; Pallab K. Chatterjee et al; Oct. 1986.

*Primary Examiner*—Michael J. Tokar
*Attorney, Agent, or Firm*—Oblon, Spivak, McClelland, Maier & Neustadt

[57] ABSTRACT

A magnetic resonance imaging system includes magnetic resonance signal detecting means (1, 2, 3, 4, 7, 8, 10) for detecting a magnetic resonance signal from an object to be examined, receiving means (9) for phase-sensitive detecting and amplifying the magnetic resonance signal, data acquiring means (11) for sampling and digitizing the magnetic resonance signal obtained by the receiving unit (9), and image reconstructing means (12) for performing image reconstruction on the basis of the magnetic resonance signal and the sampling data obtained by the data acquiring means (11). The magnetic resonance imaging system includes a reference signal phase correcting circuit (26) for correcting a phase of a phase-sensitive detecting reference signal, a base line correcting circuit (27) for correcting a base line of the magnetic resonance signal detected by the magnetic resonance signal detecting means (1, 2, 3, 4, 7, 8, 10), and a sampling point correcting circuit (28) for correcting a sampling point of the magnetic resonance signal in the data acquiring means (11).

14 Claims, 8 Drawing Sheets

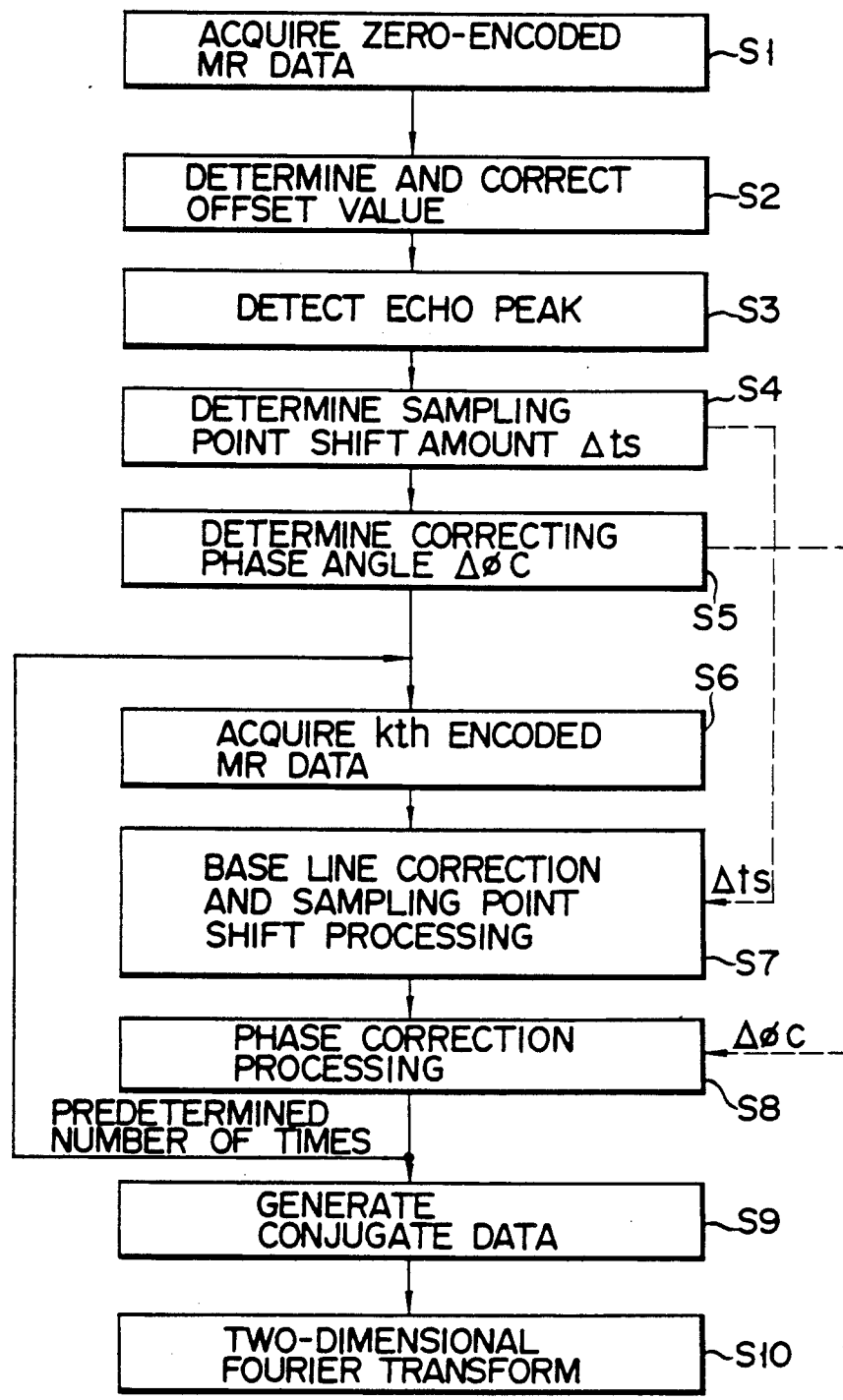
F I G. 1

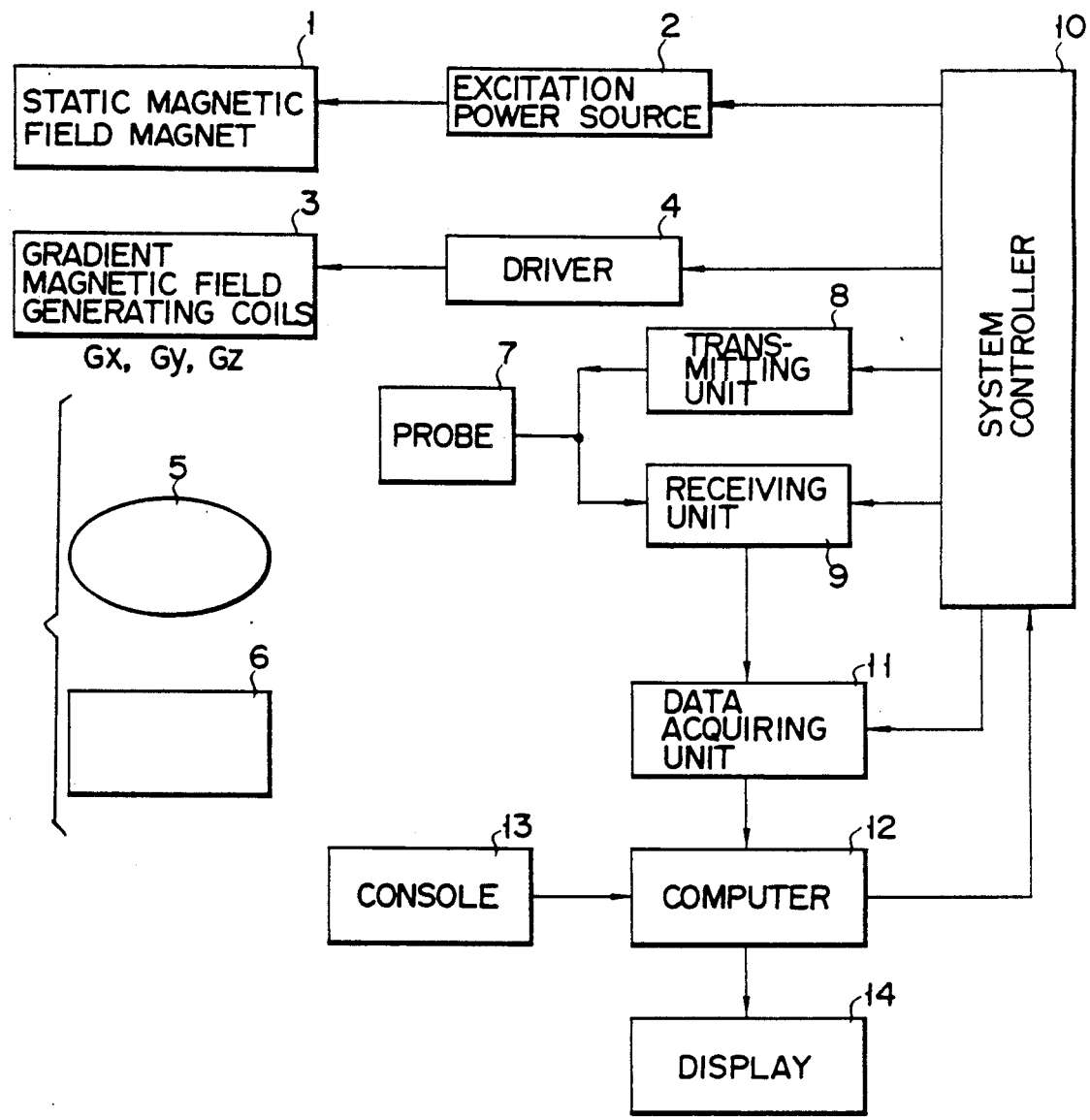
F I G. 2

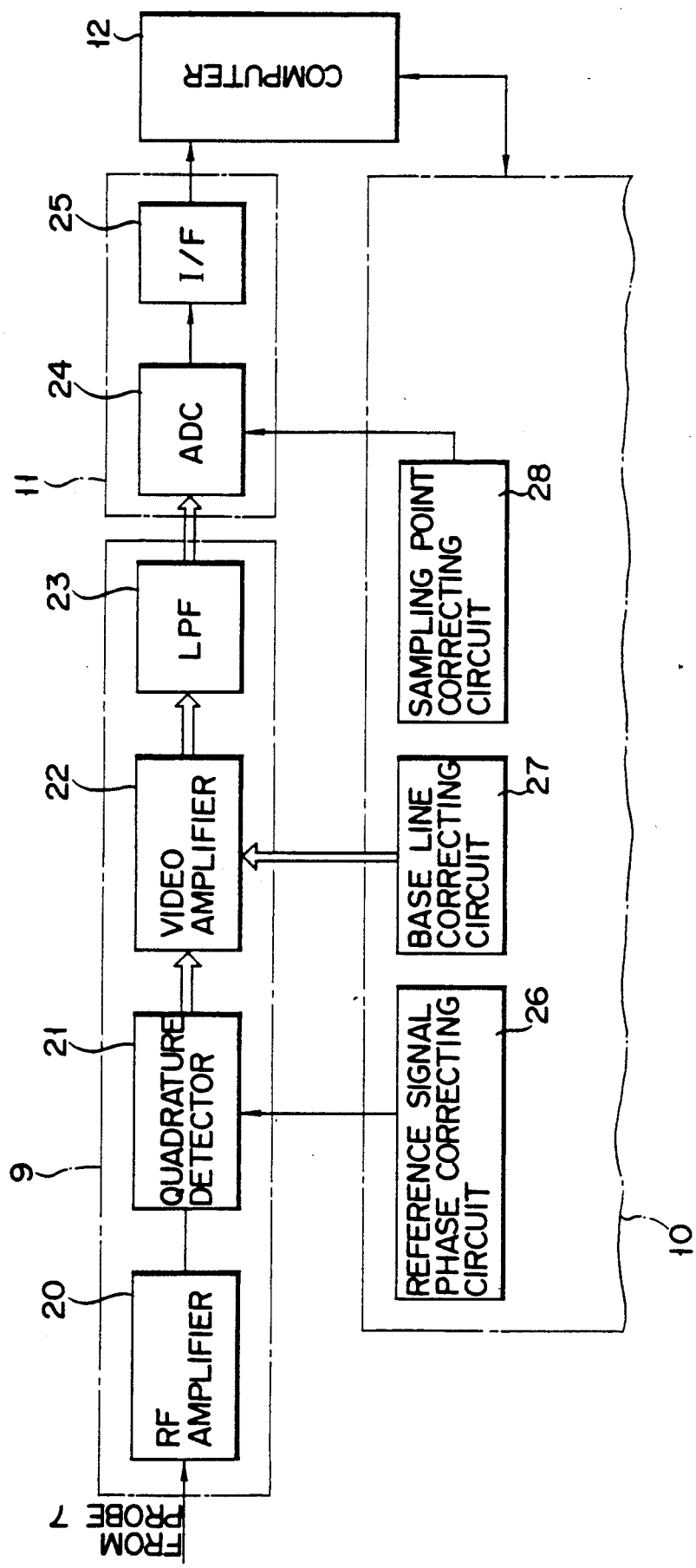
F I G. 3

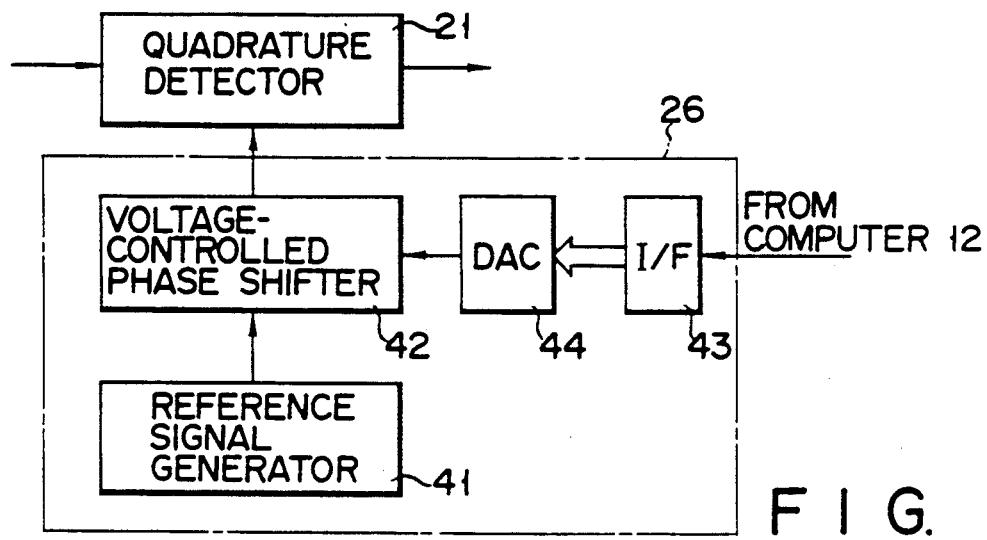
F I G. 5
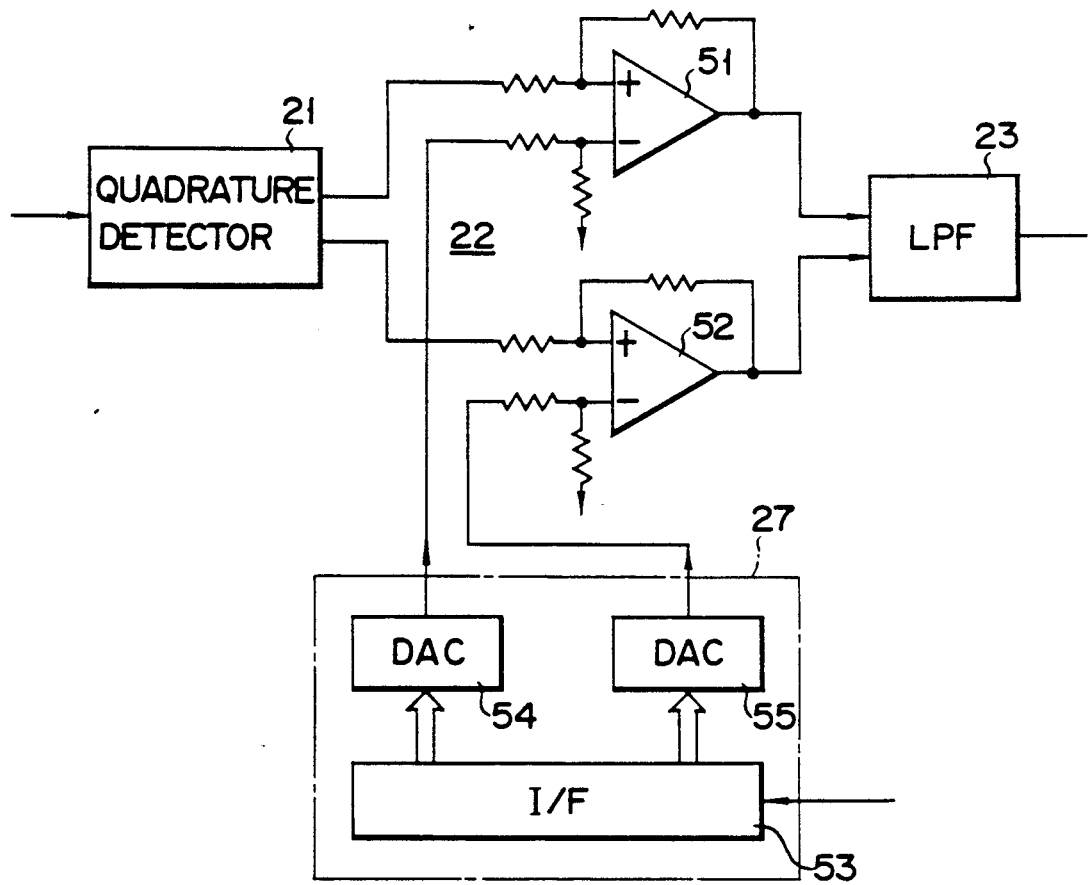
F I G. 6

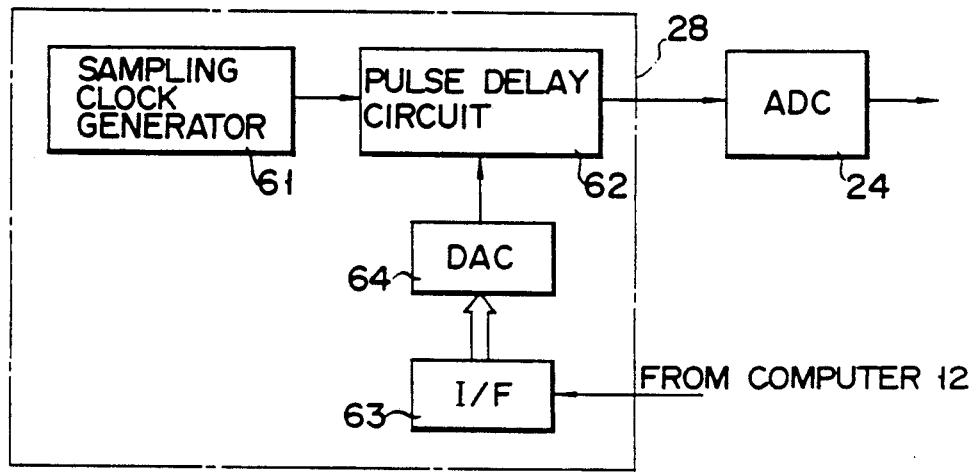
F I G. 7
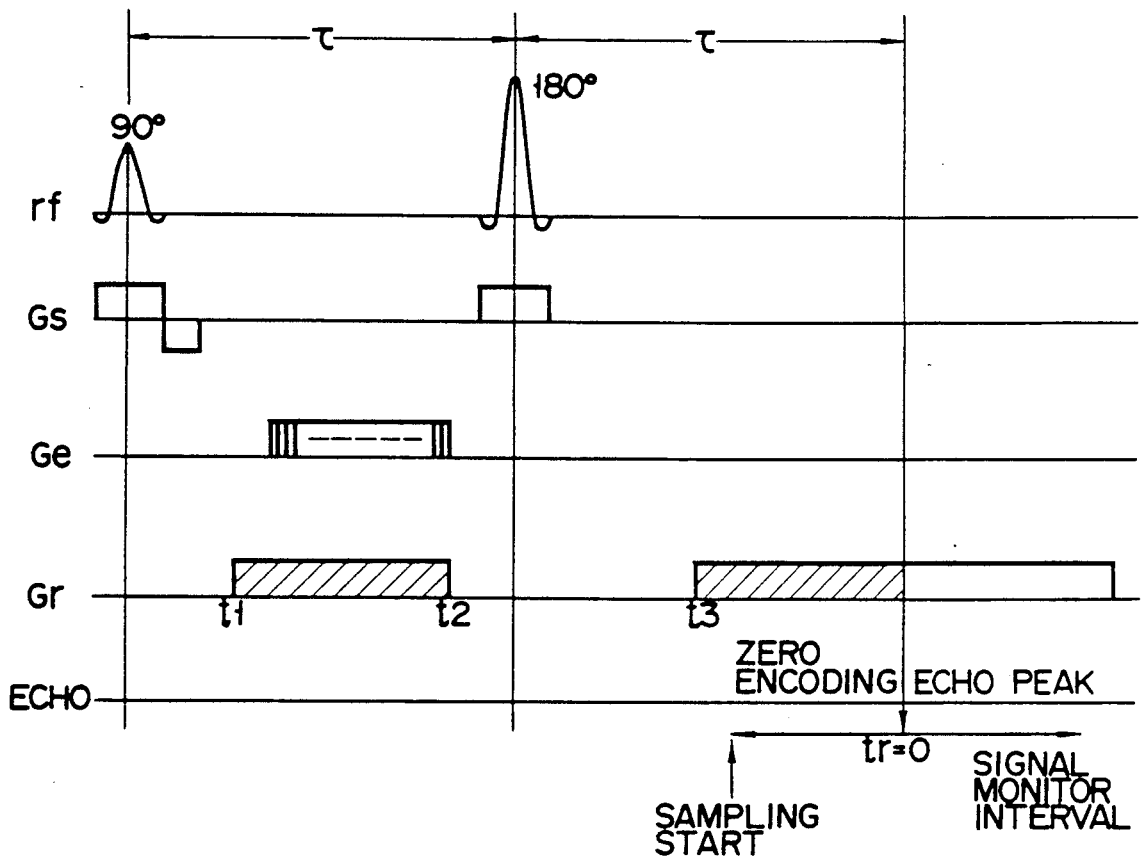
F I G. 8

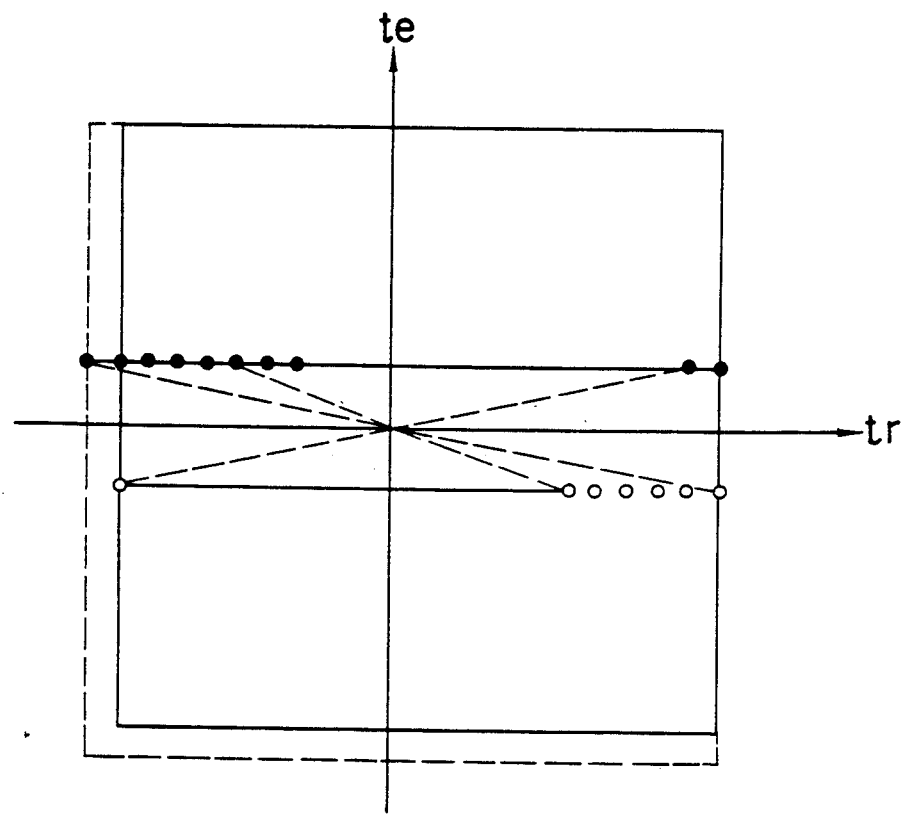
F I G. 9A
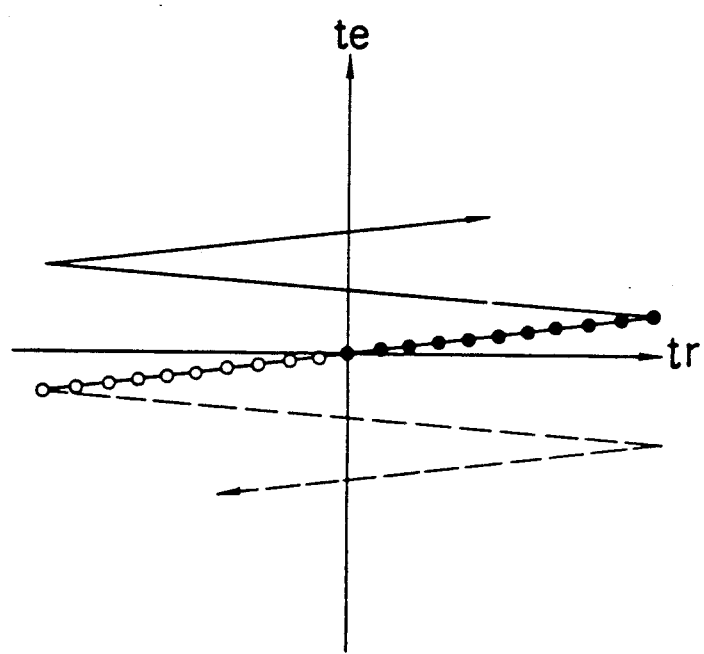
F I G. 9B

MAGNETIC RESONANCE IMAGING SYSTEM

BACKGROUND OF THE INVENTION

1. Field of the Invention

The present invention relates to a magnetic resonance imaging system and, more particularly, to a magnetic resonance imaging system in which correction is performed for acquired magnetic resonance data by hardware, thereby reducing a load on software processing except for Fourier transform processing for image reconstruction and improving throughput of the system.

DISCUSSION OF BACKGROUND

As is well known, magnetic resonance imaging is a technique capable of obtaining chemical and physical microscopic information about molecules by utilizing a phenomenon in which when atomic nuclei having a specific spin and a magnetic moment based on the spin are placed in a uniform static magnetic field, the atomic nuclei resonantly absorb an energy of an RF magnetic field rotating at a predetermined frequency in a plane perpendicular to the direction of the static magnetic field.

As a method of visualizing a spatial distribution of specific atomic nuclei (e.g., hydrogen atomic nuclei contained in water and fat) in an object to be examined by using the magnetic resonance imaging, a projecting reconstruction method by Lauterbur, a Fourier method by Kumar, Welti, or Ernst, a spin warp method as a modification of the Fourier method by Hutchison et al., an echo planar method by Mansfield, and the like have been proposed.

When the magnetic resonance imaging is to be performed on the basis of these methods, in order to obtain a reconstructed image with high precision and high image quality from acquired magnetic resonance data, correction is performed for various error factors.

For example, correction of a base line of a magnetic resonance signal (echo), correction of a sampling point of magnetic resonance data, and phase correction of a detection reference signal can be considered as the correction performed upon acquisition of magnetic resonance data and reconstruction of a magnetic resonance image. As a method of performing these correction operations, a method of performing base line correction, shifting of a sampling point based on an interpolation operation, and phase correction can be performed by software processing for the acquired magnetic resonance data, as pre-processing prior to image reconstruction processing. By Fourier-transforming the corrected magnetic resonance data by the above correction processing, image reconstruction can be properly performed.

Especially in a so-called half encoding method in which data of a half of a Fourier space is obtained on the basis of measurement data of the other half by utilizing the fact that data point-symmetrical about the origin of the Fourier space are complex conjugate with each other, a magnetic resonance data error greatly adversely affects a reconstructed image. Therefore, the above correction processing is essential.

FIG. 1 shows a procedure of magnetic resonance data acquisition and image reconstruction including the above correction processing based on the half encoding method.

First, magnetic echo data (to be referred to as "zero-encoded MR data" hereinafter) which are not phase-encoded are acquired from an object to be examined or a proper phantom by a magnetic, resonance excitation sequence excluding application of a gradient magnetic field for phase encoding (step S1). On the basis of the acquired zero-encoded MR data, an offset value of an echo signal is obtained, and the offset is corrected (step S2). On the basis of the acquired zero-encoded MR data, a peak point position of a norm of the echo signal is detected (step S3). On the basis of the detected peak point position, a shift amount $\Delta t s$ for correcting a sampling point position is obtained (step S4). On the basis of the zero-encoded MR data at the peak point position, a correction phase angle $\Delta \phi c$ for a detection reference signal is obtained (step S6). After the above preliminary measurements and correction value determination processing are performed, main measurements and image reconstruction processing are performed as follows.

By an imaging magnetic resonance excitation sequence (including application of a phase encoding gradient magnetic field), magnetic resonance data (to be referred to as "kth-encoded MR data" hereinafter) is acquired by kth (k=1, 2, ...) encoding (step S6). Base line correcting processing and sampling point shift processing based on an interpolation operation and using a sampling point correction amount $\Delta \phi c$ obtained in step S4 are performed for the acquired kth-encoded MR data (step S7). Detection reference signal phase correction processing is performed for the data obtained in step S7 by using the correction phase angle $\Delta \phi c$ obtained in step S5 (step S8). Steps S6 to S8 are repeatedly performed a predetermined number of times to acquire and correct magnetic resonance data required for image reconstruction based on the half encoding method. On the basis of the magnetic resonance data acquired and corrected as described above, point-symmetrical data in the Fourier space are generated (step S9). The magnetic resonance data obtained in the above processing are two-dimensionally Fourier-transformed to obtain a reconstructed image (step S10).

The base line correction and sampling point shifting in step S7 and the detection reference signal phase correction in step S8 correspond to the correction processing described above. These processing operations are performed by software.

When the above correction processing is to be performed by software as described above, a long time period is required for calculations and data transfer for executing the above correction processing. Therefore, the processing time must be reduced in order to improve throughput of the magnetic resonance imaging system.

Especially in multi-slice imaging for obtaining magnetic resonance data of a plurality of slices of an object to be examined and obtaining a magnetic resonance image of the plurality of slices or in three-dimensional imaging for acquiring magnetic resonance data of a three-dimensional imaging region corresponding to a plurality of adjacent slices of an object to be examined and obtaining magnetic resonance image information of the three-dimensional imaging region, values of a sampling point shift amount $\Delta t s$ and a phase angle $\Delta \phi c$ for correction differ for the respective slices of the object to be examined. In addition, in the multi-slice and three-dimensional imaging, an amount of data to be processed is enormous for imaging of each slice. Therefore, a strong demand has arisen for reducing a time required for the above correction processing in the multi-slice and three-dimensional imaging.

In order to perform the above interpolation operation with sufficient precision, sampling must be performed at a relatively high speed compared to a sampling pitch determined by a Nyquist frequency. For example, in order to form an image of a (256×256) matrix, signal sampling is performed for 1,024 or 512 points. The above various correction processing operations are performed for the sampled data, and the data are selected every four points to obtain 256 points. A two-dimensional Fourier transform operation is then performed to obtain an image. In this case, a memory must have a capacity larger than that originally required. In addition, a time required for the correction processing is prolonged.

A magnetic resonance signal changes at high rate near the origin (i.e., near a peak echo) of the Fourier space. For this reason, the magnetic resonance signal near the peak echo must be interpolated with sufficiently high precision. Therefore, high-order interpolation is performed as the interpolation operation. Such high-order interpolation, however, requires a very long calculation time.

In addition, the interpolation operation originally includes an error to a certain degree. Therefore, it is desired to obtain correct data in the Fourier space without the interpolation operation, if possible.

In a so-called full encoding method in which encoding is performed for the entire Fourier space, an absolute-value image can be obtained from real- and imaginary-part images obtained by Fourier transform without performing an interpolation operation. In this case, not only a calculation time is required for obtaining an absolute value, but also a negative signal region of an inversion recovery image (IR image) is inverted because phase information is lost. For this reason, decisive problems, in which a correct IR image cannot be obtained and a flow rate distribution cannot be imaged using phase information, arise. That is, even when the full encoding method is applied, it is generally required to perform the interpolation operation to obtain a correct real-part image. In this case, substantially the same problems as in the half encoding method in which the interpolation operation is essential to generate data of a half space arise.

A computer for use in the magnetic resonance imaging system is normally a so-called mini-computer. Even if an exclusive calculating apparatus is added to such a computer, a calculation time of several seconds is required for image reconstruction of a (256×256) matrix. For this reason, the system requiring the above various software correction operations cannot perform image reconstruction within a short time period (e.g., about 10 msec) to display an image of a dynamic object portion such as a heart on a display unit in real time.

In recent years, however, since an S/N ratio in magnetic resonance measurement is improved as magnetic resonance measuring techniques have progressed, a flip angle caused by excitation can be set much smaller (e.g., 10°) than 90° which is generally used to sufficiently increase a speed of recovery to a thermal equilibrium state as compared with a spin lattice relaxation (longitudinal relaxation) time (T1). Therefore, unlike in a conventional system, a wait time for recovery to the thermal equilibrium state after magnetic resonance data acquisition can be set to be substantially zero, thereby performing semi-continuous excitation of a spin system.

By combining the use of such a small flip angle and a ultra-high-speed imaging method such as the echo planar method and the high-speed Fourier method, it is assumed to be possible to realize a real-time magnetic resonance imaging system. To realize such a system, an image reconstruction time is also desired to be significantly reduced. Therefore, since image reconstruction in the magnetic resonance imaging system is originally only a Fourier transform operation, it is assumed to be very effective to achieve a system arrangement not requiring pre- or post-processing except for the Fourier transform operation in order to reduce the image reconstruction time.

As described above, in the magnetic resonance imaging system, when various correction processing operations are performed by software in a computer, a long time period and an unnecessary memory capacity are required for imaging Therefore, a demand has arisen for a countermeasure against this problem.

The present invention has been made to solve the above problem and to provide a magnetic resonance imaging system in which simple hardware is added for correction processing so that the correction processing can be performed by a simple procedure using the hardware to obtain proper magnetic resonance data, and image reconstruction can be performed by merely Fourier transform (two-dimensional Fourier transform in the case of a two-dimensional image, and three-dimensional transform in the case of a three-dimensional image), thereby significantly reducing a time required for the reconstruction.

SUMMARY OF THE INVENTION

In order to achieve the above object of the present invention, a magnetic resonance imaging system of the present invention comprises a base line correcting circuit for correcting a base line of a magnetic resonance signal, a sampling point correcting circuit for correcting a shift of a sampling point of the magnetic resonance signal (or an application time adjusting circuit for a reading gradient magnetic field), and a reference signal phase correcting circuit for correcting a phase of a phase-sensitive detection reference signal of the magnetic resonance signal. In the magnetic resonance imaging system of the present invention, on the basis of data obtained by a predetermined procedure in a correction data determination mode, a computer supplies a correction value to the above circuits to perform an operation in an imaging mode, thereby automatically obtaining sampling data of a magnetic resonance signal for correct image reconstruction.

According to the magnetic resonance imaging system of the present invention, correct image reconstruction magnetic resonance data can be obtained by hardware, e.g., the above three correcting circuits. Therefore, since a magnetic resonance reconstructed image can be obtained by only Fourier transform without performing correction processing using software, a reconstruction time can be significantly reduced. As a result, a diagnostic efficiency is improved, and a more practical real-time magnetic resonance imaging system is realized.

BRIEF DESCRIPTION OF THE DRAWINGS

FIG. 1 is a flow chart for explaining various correction procedures by software processing in a magnetic resonance imaging system; FIG. 2 is a block diagram showing an overall magnetic resonance imaging system; FIG. 3 is a block diagram showing an arrangement of a main part of the magnetic resonance imaging system according to an embodiment of the present invention; FIG. 5 is a block diagram for explaining an arrangement of a reference signal phase correcting circuit in the embodiment shown in FIG. 3; FIG. 6 is a block diagram for explaining an arrangement of a base line correcting circuit in the embodiment shown in FIG. 3; FIG. 7 is a block diagram showing an arrangement of a sampling point correcting circuit in the embodiment shown in FIG. 3; FIG. 8 is a timing chart showing a pulse sequence according to a two-dimensional Fourier method; FIGS. 9(a) and 9(b) are graphs for explaining a data constructing method in a half space based on a point symmetry in accordance with a Fourier method and an echo planar method, respectively.

DETAILED DESCRIPTION OF THE PREFERRED EMBODIMENT

Figure 4:
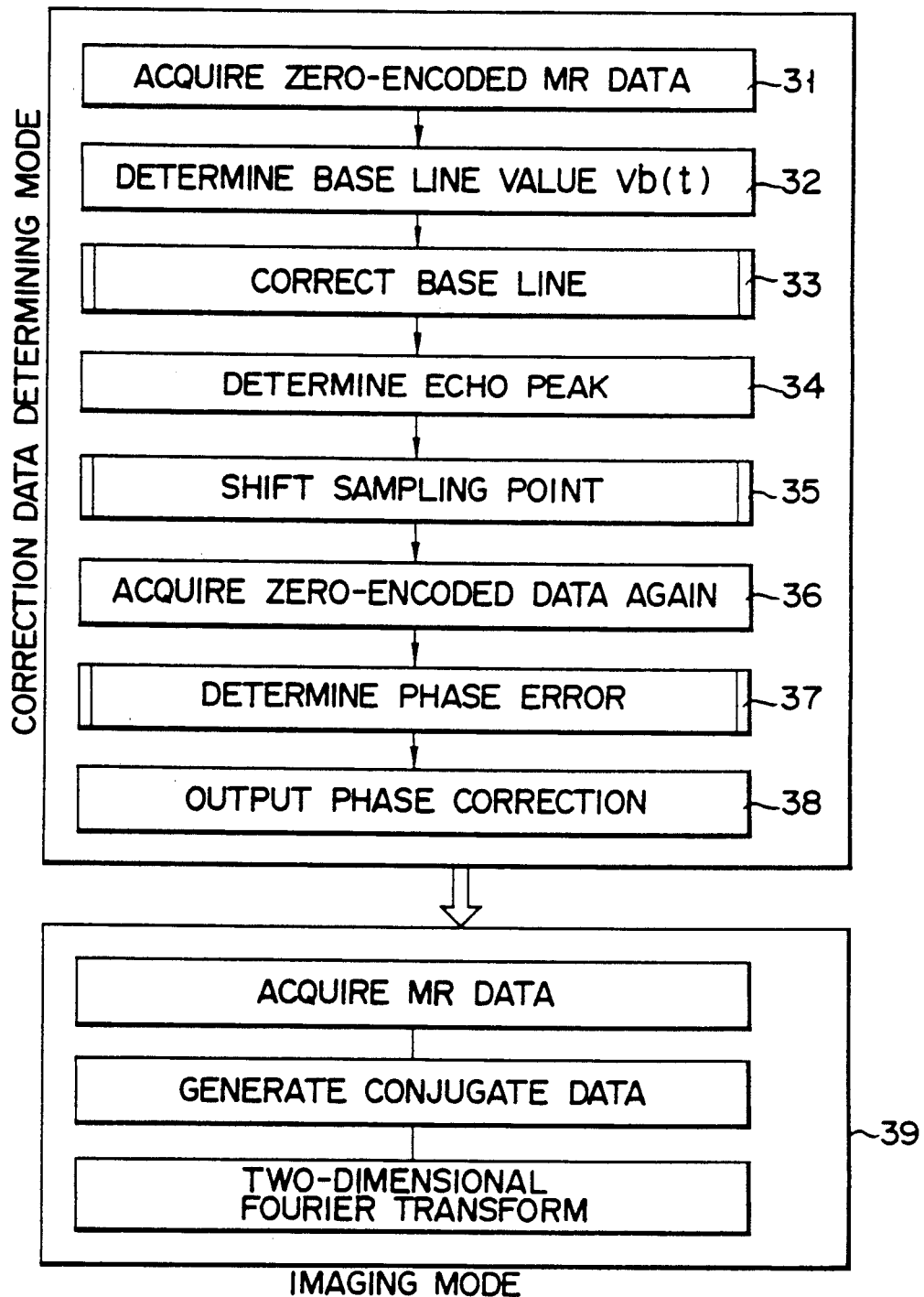
FIG. 4 is a flow chart for explaining a correction processing procedure in the embodiment shown in FIG. 3.

An embodiment of the present invention will be described in detail below with reference to the accompanying drawings.

FIG. 2 is a block diagram showing an arrangement of a magnetic resonance imaging system according to an embodiment of the present invention.

A static magnetic field magnet 1 comprises a plurality of coil units. The static magnetic field magnet 1 is driven by an excitation power source 2 controlled by a system controller 10 and applies a uniform static magnetic field to an object to be examined 5 (e.g., a patient) laid on a bed 6.

A gradient magnetic field coil 2 comprises, e.g., a plurality of sets of coil elements The gradient magnetic field coil 2 is driven by a driver 4 controlled by the system controller 10 and applies gradient magnetic fields Gx, Gy, and Gz, whose magnetic field intensities linearly change in orthogonal x and y directions in a desired slice plane and a z direction perpendicular to the slice plane, respectively, to the object to be examined 5 (so as to superpose them on the static magnetic field).

Under the control of the controller 10, an RF magnetic field generated from a probe 7 by an RF signal from a transmitting unit 8 is applied to the object to be examined 5. A magnetic resonance signal received by the probe 7 is amplified and detected by a receiving unit 9 and then supplied to a data acquiring unit 11 under the control of the controller 10.

That is, as shown in FIG. 3, in the receiving unit 9, the magnetic resonance signal received by the probe 7 is amplified by an RF amplifier 20, quadrature-detected and converted into a video-band signal by an quadrature detector 21, amplified by a video amplifier 22, and supplied to the data acquiring unit 11 via a low-pass filter 23. In the data acquiring unit 11, the magnetic resonance signal supplied from the receiving unit 9 is sampled and digitized by an A/D converter 24. The digitized signal is then supplied to a computer 12 via an interface 25.

The computer 12 is operated by an operator via a console 13. On the basis of the sampled magnetic resonance data for image formation supplied from the data acquiring unit 11, the computer 12 performs image reconstruction processing and obtains magnetic resonance image data. The computer 12 controls the system controller 10. The image data obtained by the computer 12 is supplied to an image display 14 and displayed as an image.

FIG. 3 shows in detail a part (correcting circuit) related to the present invention in the system controller 10 shown in FIG. 2 and arrangements of the receiving unit 9 and the data acquiring unit 11.

The system controller 10 comprises a reference signal phase correcting circuit 26 for correcting a phase of a reference signal to be supplied to the quadrature detector 21, a base line correcting circuit 27 for correcting an offset of a base line of a magnetic resonance signal, and a sampling point correcting circuit 28 for delay-controlling a timing of a sampling clock to be supplied to the A/D converter 24.

FIG. 4 shows a procedure for performing imaging on the bases of a pulse sequence of a two-dimensional Fourier method shown in FIG. 8.

Prior to an imaging mode operation for final imaging, a correction data determining mode operation for determining correction data is performed.

In accordance with a sequence obtained by excluding an encoding gradient magnetic field Ge from the sequence shown in FIG. 8, i.e., in accordance with a zero encoding excitation sequence, an RF pulse rf, a slicing gradient magnetic field Gs, and a reading gradient magnetic field Gr are applied to the object to be examined 5 or a proper phantom prepared for adjustment, and a magnetic resonance echo signal in a zero encoding state is observed, thereby acquiring zero-encoded MR data (step 31). A timing (t1, t2, and t3) for applying the reading gradient magnetic field Gr is set in advance upon adjustment of the pulse sequence so that an echo peak appears at a predetermined timing (t=2τ). Similarly, a base line and a phase (an absolute phase and a 90° relative phase in quadrature detection) of a reference signal for detection are properly set upon adjustment. A series of operations from steps 31 to 38 aims at correcting these offsets derived from some causes.

By performing data acquisition in a time region in which the echo signal is completely attenuated, an offset value, a base line value Vb(t), is obtained for the zero-encoded MR data (step 32). In order to obtain the base line value Vb(t) with a time variation, data acquisition may be performed at a predetermined timing in a no signal state, e.g., a state in which the gradient magnetic fields Gs and Gr are applied by a sequence not applying the RF pulse rf (when the base line value Vb(t) also varies by phase encoding, a sequence including the encoding gradient magnetic field can be used to obtain the base line value Vb(t) upon encoding). When an S/N ratio (signal-to-noise ratio) is not sufficient upon acquisition of the base line values, averaging is performed by a plurality of times of data acquisition. An offset of the video amplifier 22 shown in FIG. 2 is adjusted by using the determined base line value Vb(t), thereby correcting the base line (step 33). An echo peak is detected by an interpolation operation on the basis of a norm (data corresponding to the size of an echo amplitude vector, i.e., an absolute value of complex data) of the zero-encoded MR data (step 34). An offset of the echo peak from a nearest sampling timing is obtained as Δts. A sampling timing of the echo data in the A/D converter 24 is shifted back and forth by Δts (step 35), and the zero-encoded MR data are acquired again (step 36). Since the data is already subjected to base line correction and sampling point shift correction by hardware, a correcting phase angle Δφc with respect to a phase error is immediately determined at the echo peak ($tr=0$) by using a known algorithm, i.e., by $\tan\Delta\phi c = Vi/Vr$ from complex data $Vr+iVi$ at the echo peak point (step 37). A phase of the quadrature detecting reference signal to be supplied to the quadrature detector 21 shown in FIG. 2 is shifted by $\Delta\phi c$ (step 38).

By the above procedure, the correction operations of the correcting circuits 26, 27, and 28 shown in FIG. 3 are completed. Therefore, an imaging mode operation will be performed next.

In the imaging mode, on the basis of the pulse sequence shown in FIG. 8, phase encoding is performed by Ge in accordance with predetermined steps, thereby acquiring echo data in a half space, e.g., a region of $te \geq 0$ in the Fourier space shown in FIG. 9(a). Since echo data point-symmetrical about the origin are complex conjugate with each other, echo data in a region of the other half space ($te < 0$) are immediately generated on the basis of the acquired echo data. Thereafter, an desired image can be obtained by only a two-dimensional Fourier transform operation (step 39).

Detailed arrangements of the correcting circuits 26, 27, and 28 shown in FIG. 3 will be described below with reference to FIGS. 5, 6, and 7, respectively.

FIG. 6 shows the base line correcting circuit 27 and its peripheral circuits. The video amplifier 22 comprises two differential amplifiers 51 and 52. The video amplifier 22 voltage-amplifies a detection output of real and imaginary parts of an echo signal supplied from the quadrature detector 21 and supplies it to the low-pass filter 23. The base line correcting circuit 27 applies the base line value $Vb(t)$ obtained by the computer 12 in step 32 shown in FIG. 4 to the inverting input terminals of differential amplifiers 51 and 52 via an interface 51 and D/A converters 54 and 55, thereby automatically performing base line correction.

FIG. 7 shows the sampling point correcting circuit 28 and its peripheral circuit The sampling point correcting circuit 28 supplies an output pulse from a sampling clock generator 61 as a sampling clock to the A/D converter 24 shown in FIG. 3 via a voltage-controlled pulse delay circuit 62. A delay time is determined by the computer 12 by the above-mentioned procedure and supplied as a control voltage from the computer 12 to the pulse delay circuit 62 via an interface 63 and a D/A converter 64. A delay time td is determined to satisfy, e.g., $0 \leq td < \Delta ts$ assuming that a sampling interval is $\Delta ts$.

FIG. 5 shows the reference wave phase correcting circuit 26 and its peripheral circuit. In the reference signal phase correcting circuit 26, a voltage-controlled phase shifter 42 shifts the phase of a phase detecting reference signal output from a reference signal generator 41 by the correction amount $\Delta\phi c$ determined by the above-mentioned method. A control voltage corresponding to $\Delta\phi c$ is obtained by the computer 12 and supplied to the voltage-controlled phase shifter 42 via an interface 43 and a D/A converter 44. The range of $\Delta\phi c$ is, e.g., $|\Delta\phi c| \leq \pi$.

In the above embodiment, the description has been made assuming that a 90° relative phase of quadrature detection and amplitude balance between channels are adjusted beforehand. However, by using hardware and a correction procedure substantially the same as those in the above absolute phase correction, an offset from an ideal state of one or both of the 90° relative phase of quadrature detection and the amplitude balance between channels can be automatically corrected.

Figure 10:
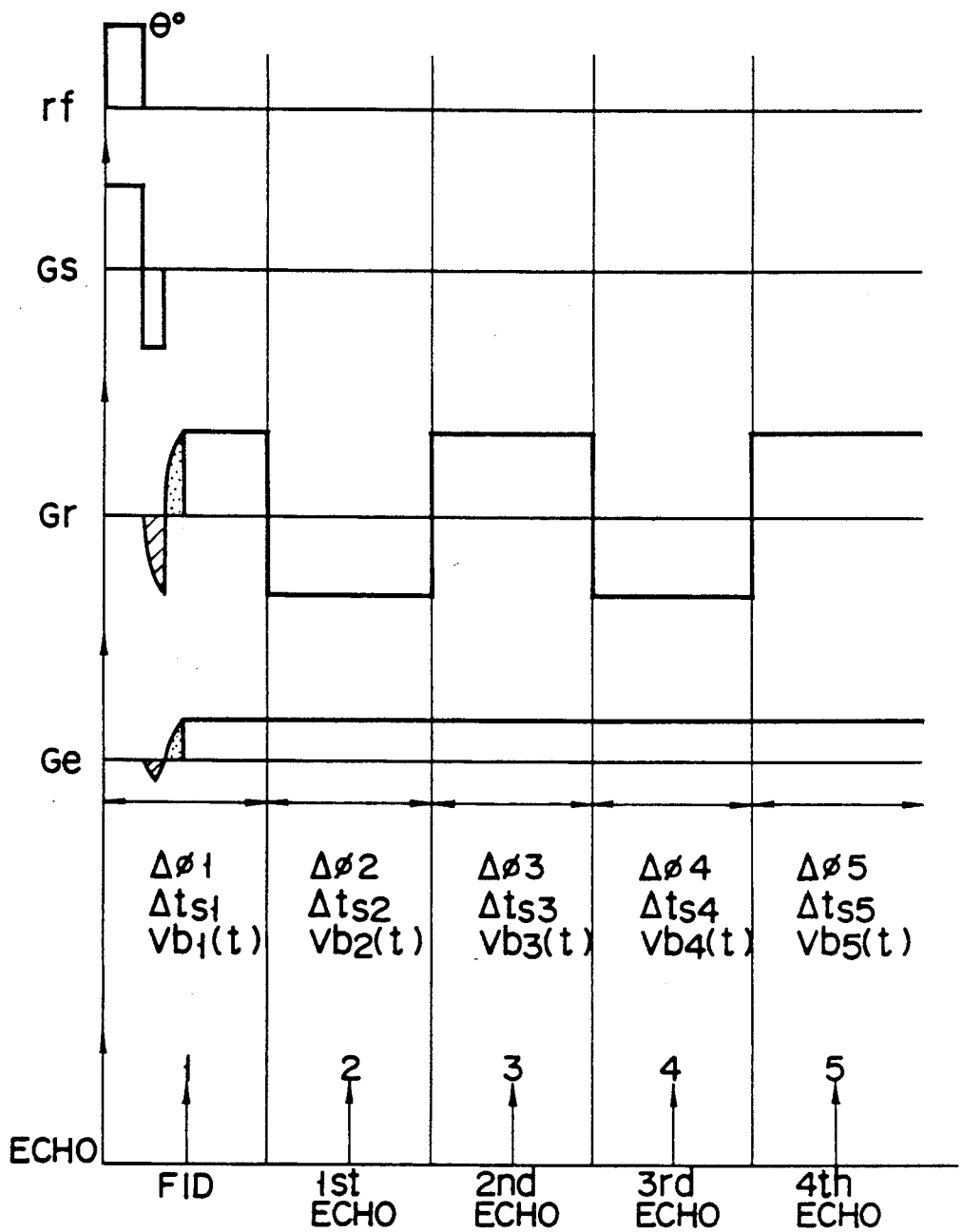
FIG. 10 is a timing chart showing a pulse sequence of the echo planar method based on a θ° pulse.

In addition to the above conventional method such as the Fourier method or the spin warp method as described above, the present invention can be applied to ultra-high-speed imaging such as an echo planar method based on a sequence shown in FIG. 10. In this case, base line correction, sampling point correction, and reference signal phase correction are performed for all signals (e.g., an FID, a first echo, and a second echo) shown in FIG. 10, if necessary. This correction can be performed by hardware and a procedure similar to those in the above embodiment except that a correction value must be sequentially changed as shown in FIG. 10 by the system controller 10 shown in FIG. 2 because correction values are generally different for the respective signals (assuming that a phase error of a kth ($k=1$, 2, 3, ...) echo is $\Delta\phi k$, a shift amount of a sampling point is $\Delta tsk$, and a base line amount is $Vbk(t)$, $\Delta\phi1 \neq \Delta\phi2 \neq \Delta\phi3$ ..., $\Delta ts1 \neq \Delta ts2 \neq \Delta ts3$ ..., $Vb1(t) \neq Vb2(t) \neq Vb3(t)$ ... ). When half encoding is applied to the echo planar method shown in FIG. 10, data acquisition and conjugate data generation in the Fourier space are as shown in FIG. 9(b).

Such a correction method is effective especially in a real-time magnetic resonance imaging system capable of repeating the sequence shown in FIG. 10 at high speed to perform real-time imaging of a dynamic organ such as a heart. That is, when the above correction is applied to the real-time magnetic resonance imaging system, the correction as shown in FIG. 2 conventionally performed by software can be omitted. Therefore, image reconstruction can be performed by only the two-dimensional Fourier transform in real time. Note that in the real-time magnetic resonance imaging, a $\theta°$ pulse ($0 < \theta° < 90°$) corresponding to a small flip angle must be used in place of a 90° pulse as an RF pulse. In addition to the above embodiment, the correcting circuits according to the present invention can be applied to any system, e.g., multi-slice imaging, three-dimensional magnetic resonance imaging, and chemical shift imaging. Furthermore, the present invention can be variously modified and carried out without departing from the spirit and scope of the invention.

It is a matter of course that even when only some of the base line correcting circuit, the sampling point correcting circuit, and the reference signal phase correcting circuit are used, the corresponding software correction processing can be omitted to reduce a load on software of a system.

Industrial Applicability

According to the present invention, since a base line correcting circuit for correcting a base line of a magnetic resonance signal, a sampling point correcting circuit for correcting a sampling point of the magnetic resonance signal, and a reference signal phase correcting circuit for correcting a phase of a phase-sensitive detection reference signal of the magnetic resonance signal are provided, image reconstruction can be performed by only a Fourier transform operation using a computer. Therefore, there is provided a magnetic resonance imaging system having a very high diagnostic efficiency and a more practical real-time magnetic resonance imaging system.

In addition, by providing at least some of the base line correcting circuit for correcting a base line of a magnetic resonance signal, the sampling point correcting circuit for correcting a sampling point of the magnetic resonance signal, and the reference signal phase correcting circuit for correcting a phase of a phase-sensitive detecting reference signal of the magnetic resonance signal according to the present invention, pre-processing performed by a computer for image reconstruction can be reduced. Therefore, a magnetic resonance imaging system having a high diagnostic efficiency can be provided.

I claim:

1. A magnetic resonance imaging system which includes magnetic resonance signal detecting means (1, 2, 3, 4, 7, 8, 10) for applying pulses of an RF magnetic field and slicing, phase-encoding, and reading gradient magnetic fields to an object to be examined placed in a uniform static magnetic field in accordance with a predetermined sequence, thereby detecting a magnetic resonance signal from said object to be examined, receiving means (9) for phase-sensitive detecting and amplifying the magnetic resonance signal, data acquiring means (11) for sampling and digitizing the magnetic resonance signal obtained by said receiving means (9), and image reconstructing means (12) for performing image reconstruction on the basis of sampling data of the magnetic resonance signal obtained by said data acquiring means (11), comprising:
a reference signal phase correcting circuit (26) for correcting a phase of a phase-sensitive detecting reference signal in said receiving means (9);
a base line correcting circuit (27) for correcting a base line of the magnetic resonance signal detected by said magnetic resonance signal detecting means (1, 2, 3, 4, 7, 8, 10); and
a sampling point correcting circuit (28) for correcting a sampling point of the magnetic resonance signal in said data acquiring means (11).

2. A system according to claim 1, wherein said reference signal phase correcting circuit (26), said base line correcting circuit (27), and said sampling point correcting circuit (28) are controlled on the basis of a phase correction value, a base line value, and a sampling point shift amount, respectively, obtained by a computer (12) prior to image reconstruction.

3. A system according to claim 1, wherein said base line correcting circuit (27) includes means for controlling an offset value of an amplifying system of said receiving means (9).

4. A system according to claim 1, wherein said reference signal phase correcting circuit (26), said base line correcting circuit (27), and said sampling point correcting circuit (28) are controlled on the basis of a phase correction value, a base line value, and a sampling point shift amount, respectively, obtained by a computer (12) prior to image reconstruction in accordance with a sequence not performing a phase encoding beforehand.

5. A system according to claim 1, wherein said magnetic resonance signal detecting means (1, 2, 3, 4, 7, 8, 10) includes means for obtaining only magnetic resonance data corresponding to Fourier data in a half region of a Fourier space, and said image reconstructing means (12) includes means for obtaining data of the other half space on the basis of the magnetic resonance data by utilizing the fact that data point-symmetrical about the origin of the Fourier space are complex conjugate with each other, thereby performing image reconstruction.

6. A system according to claim 1, wherein said magnetic resonance signal detecting means (1, 2, 3, 4, 7, 8, 10) includes means for detecting a multiple echo signal train as a magnetic resonance signal, and said reference signal phase correcting circuit (26) includes means for independently correcting the phase-sensitive detecting reference signal for each echo signal of the multiple echo signal train.

7. A system according to claim 1, wherein said magnetic resonance signal detecting means (1, 2, 3, 4, 7, 8, 10) includes means for detecting a magnetic resonance signal generated upon magnetic resonance excitation of a flip angle of less than 90°.

8. A magnetic resonance imaging system which includes magnetic resonance signal detecting mans for applying pulses of an RF magnetic field and slicing, phase-encoding, and reading gradient magnetic fields to an object to be examined placed in a uniform static magnetic field in accordance with a predetermined sequence, thereby detecting a magnetic resonance signal from said object to be examined, receiving means for phase-sensitive detecting and amplifying the magnetic resonance signal, data acquiring means for sampling and digitizing the magnetic resonance signal obtained by said receiving means, and image reconstructing means for performing image reconstruction on the basis of sampling data of the magnetic resonance signal obtained by said data acquiring means, comprising:
a base line correcting circuit for correcting a base line of the magnetic resonance signal detected by said magnetic resonance signal detecting means; and
a sampling point correcting circuit for correcting a sampling point of the magnetic resonance signal in said data acquiring means.

9. A system according to claim 8, wherein said base line correcting circuit and said sampling point correcting circuit are controlled on the basis of a base line value and a sampling point shift amount, respectively, obtained by a computer prior to image reconstruction.

10. A system according to claim 8, wherein said base line correcting circuit includes means for controlling an offset value of an amplifying system of said receiving means.

11. A system according to claim 8, wherein said base line correcting circuit and said sampling point correcting circuit are controlled on the basis of a base line value and a sampling point shift amount, respectively, obtained by a computer prior to image reconstruction in accordance with a sequence not performing a phase encoding beforehand.

12. A system according to claim 8, wherein said magnetic resonance signal detecting means includes means for obtaining only magnetic resonance data corresponding to Fourier data in a half region of a Fourier space, and said image reconstructing means includes means for obtaining data of the other half space on the basis of the magnetic resonance data by utilizing the fact that data point-symmetrical about the origin of the Fourier space are complex conjugate with each other, thereby performing image reconstruction.

13. A system according to claim 8, wherein said magnetic resonance signal detecting means includes means for detecting a multiple echo signal train as a magnetic resonance signal.

14. A system according to claim 8, wherein said magnetic resonance signal detecting means includes means for detecting a magnetic resonance signal generated upon magnetic resonance excitation of a flip angle of less than 90°.

* * * * *